(12) United States Patent
Kim et al.

(10) Patent No.: US 8,791,448 B2
(45) Date of Patent: Jul. 29, 2014

(54) SEMICONDUCTOR MEMORY DEVICES HAVING STRAPPING CONTACTS

(71) Applicants: Jung-in Kim, Seoul (KR); Jae-hee Oh, Seongnam-si (KR); Jun-hyok Kong, Seoul (KR); Sung-ho Eun, Seoul (KR); Yong-tae Oh, Seoul (KR)

(72) Inventors: Jung-in Kim, Seoul (KR); Jae-hee Oh, Seongnam-si (KR); Jun-hyok Kong, Seoul (KR); Sung-ho Eun, Seoul (KR); Yong-tae Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/630,505

(22) Filed: Sep. 28, 2012

(65) Prior Publication Data

US 2013/0187119 A1    Jul. 25, 2013

Related U.S. Application Data

(62) Division of application No. 12/073,661, filed on Mar. 7, 2008, now abandoned.

(30) Foreign Application Priority Data

Mar. 27, 2007 (KR) ........................ 10-2007-0030045

(51) Int. Cl.
*H01L 45/00* (2006.01)
*H01L 23/48* (2006.01)

(52) U.S. Cl.
USPC   257/5; 257/773; 257/E23.011; 257/E23.141; 257/E23.151

(58) Field of Classification Search
USPC ............ 365/63; 257/2–5, 734, 773, E23.011, 257/E23.141, E23.151; 3/63
See application file for complete search history.

(56) References Cited

U.S. PATENT DOCUMENTS 5,416,349 A    5/1995   Bergemont
6,795,345 B2   9/2004   Ooishi
(Continued)

FOREIGN PATENT DOCUMENTS

| JP | 2006-222215 | 8/2006 |
| KR | 1020060094424 | 8/2006 |
| TW | 200535840 A | 11/2005 |
| TW | 200620303 B | 6/2006 |

OTHER PUBLICATIONS

Taiwanese Office Action dated Mar. 25, 2014 issued in corresponding Taiwanese Application No. TW097109180 and English language translation.

*Primary Examiner* — Allison P Bernstein
(74) *Attorney, Agent, or Firm* — Harness, Dickey & Pierce, P.L.C.

(57) ABSTRACT

Semiconductor memory devices having strapping contacts are provided, the devices include cell regions and strapping regions between adjacent cell regions in a first direction. Active patterns, extending in the first direction throughout the cell regions and strapping regions, are spaced apart from one another in a second direction intersecting the first direction. First interconnection lines, extending in the first direction throughout the cell regions and strapping regions, are spaced apart from one another in the second direction while overlapping with the active patterns. Second interconnection lines, extending in the second direction, intersect the active patterns and first interconnection lines in the cell regions. The second interconnection lines are spaced apart from one another in the first direction. Memory cells are positioned at intersection portions of the first and second interconnection lines in the cell regions. The active patterns contact the first interconnection lines through strapping contacts in the strapping regions.

12 Claims, 8 Drawing Sheets

(56) References Cited

U.S. PATENT DOCUMENTS

| | | |
|---|---|---|
| 7,110,286 B2 | 9/2006 | Choi et al. |
| 7,638,878 B2 * | 12/2009 | Aritome ..................... 257/758 |
| 7,808,815 B2 | 10/2010 | Ro et al. |
| 2003/0107911 A1 * | 6/2003 | Nishihara et al. ............... 365/63 |
| 2006/0018181 A1 | 1/2006 | Matsunaga et al. |
| 2006/0056233 A1 | 3/2006 | Parkinson et al. |
| 2006/0226459 A1 | 10/2006 | Oh et al. |
| 2008/0106922 A1 | 5/2008 | Park et al. |

* cited by examiner

SEMICONDUCTOR MEMORY DEVICES HAVING STRAPPING CONTACTS

PRIORITY STATEMENT

This application is a divisional application of U.S. application Ser. No. 12/073,661, filed on Mar. 7, 2008, which claims the benefit of priority under 35 U.S.C. §119 from Korean Patent Application No. 10-2007-0030045, filed on Mar. 27, 2007, in the Korean Intellectual Property Office, the entire disclosure of each of which is incorporated herein by reference.

BACKGROUND

1. Field

Example embodiments relate to semiconductor memory devices. Other example embodiments relate to semiconductor memory devices having strapping contacts in a strapping region with an increased pitch.

2. Description of the Related Art

Semiconductor memory devices may be classified as volatile memory devices (e.g., DRAM), in which all data stored in a memory cell is erased if a power source is turned off, or as non-volatile memory devices, in which data is preserved after a power source is turned off. Non-volatile memory devices include a magnetic random access memory (MRAM), a ferroelectric random access memory (FRAM), a phase-change random access memory (PRAM), a resistor random access memory (RRAM) and the like.

Among the non-volatile memory devices, the PRAM is a memory device using a phase-change material. The phase-change material refers to a material (e.g., chalcogenide) in which a phase varies with temperature and resistance varies with the phase. An alloy material (e.g., $Ge_xSb_yTe_z$ (GST)) may be used as the phase-change material. The phase-change material may rapidly transform (or change) into one of two types of phases (e.g., amorphous and crystalline states) depending on a temperature. The phase-change material is in a high-resistance state in the amorphous state and in a low-resistance state in the crystalline state. As such, the phase-change material may be used as a semiconductor memory device, for example, by defining the high-resistance state as "reset" or logic "1" and defining the low-resistance state as "set" or logic "0."

Memory cells constituting PRAM may be classified into memory cells having transistor and diode structures. The memory cell having a transistor structure may be a memory cell in which a phase-change material layer and a transistor are connected in series to each other. The memory cell having a diode structure may be a memory cell in which a phase-change material layer and a diode are connected in series to each other. The memory cell having a diode structure may have higher integration, higher speed and/or lower power characteristics compared with the memory cell having a transistor structure.

As the integration density of a memory device increases, the cross section of a word line gradually decreases and the length of the word line gradually increases, increasing the resistance of the word line. As such, in a PRAM, a delay exists on a word line when the word line is selected.

A method of applying a uniform voltage to memory cells array on a word line having strapping contacts to prevent a voltage drop due to the increased resistance of the word line has been acknowledged. In the method, a contact margin (or pitch) between adjacent strapping contacts may be reduced as the integration density of a memory device is increased. As such, a bridge or the like may occur.

Figure 1:
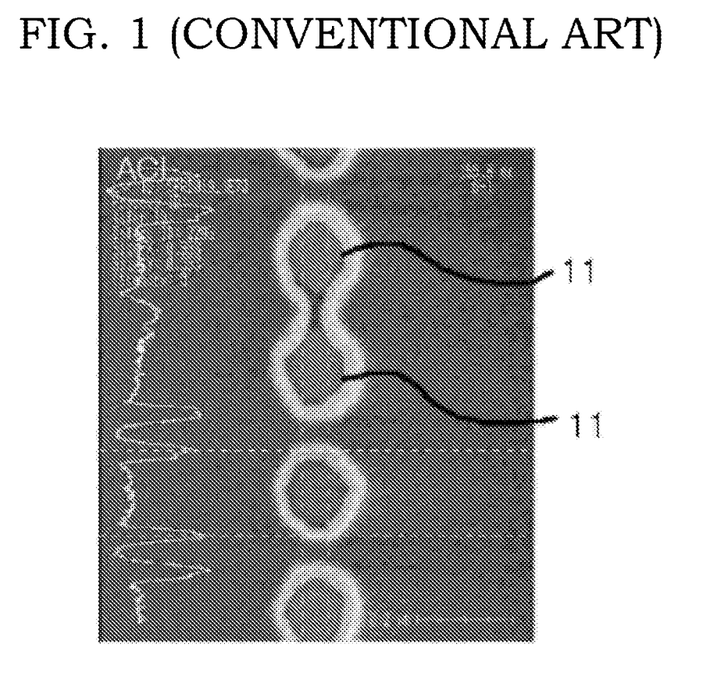
FIG. 1 is a photograph showing a bridge phenomenon between strapping contacts arranged in a strapping region of a conventional semiconductor memory device.

FIG. 1 is a photograph showing a bridge phenomenon between strapping contacts arrayed in a strapping region of a conventional semiconductor memory device.

As shown in FIG. 1, a bridge is formed between adjacent strapping contacts 11 in the strapping region.

SUMMARY

Example embodiments relate to semiconductor memory devices. Other example embodiments relate to semiconductor memory devices having strapping contacts in a strapping region with an increased pitch.

Example embodiments provide semiconductor memory devices wherein a pitch of strapping contacts in a strapping region is increased such that the likelihood of a bridge forming between adjacent strapping contacts is reduced (or prevented).

According to example embodiments, there is provided a semiconductor memory device including a plurality of cell regions and a plurality of strapping regions arranged between adjacent cell regions in a first direction on a semiconductor substrate. A plurality of active patterns extend in the first direction throughout the cell regions and strapping regions. The plurality of active patterns may be spaced apart from one another in a second direction intersecting the first direction. A plurality of first interconnection lines extend in the first direction throughout the cell regions and the strapping regions. The plurality of first interconnection lines may be spaced apart from one another in the second direction while overlapping with the active patterns. A plurality of second interconnection lines extend in the second direction to intersect the active patterns and the first interconnection lines above the cell regions. The plurality of second interconnection lines may be spaced apart from one another in the first direction. A plurality of memory cells may each be positioned at intersection portions of the first and second interconnection lines in the cell regions. A plurality of strapping contacts may be arranged in the strapping regions. The active patterns may contact the first interconnection lines through the strapping contacts. The plurality of strapping contacts may be in a zigzag form in the strapping regions.

The strapping contacts in each strapping regions may be on the active patterns in a zigzag form in the second direction. The strapping contacts within adjacent strapping regions may be arranged on the active patterns in a zigzag form in the second direction. The first interconnection lines may include word lines. The second interconnection lines include bit lines. The active patterns may include impurity regions doped with predetermined conductive type impurities in the semiconductor substrate. The memory cells may include phase-change random access memory (PRAM) cells.

According to example embodiments, there is provided a semiconductor memory device including a plurality of cell regions and a plurality of strapping regions between adjacent cell regions in a first direction on a semiconductor substrate. A plurality of active patterns extend in the first direction throughout the cell regions and strapping regions. The plurality of active patterns may be spaced apart from one another in a second direction intersecting the first direction. A plurality of first interconnection lines extend in the first direction throughout the cell regions and the strapping regions. The plurality of first interconnection lines may be spaced apart from one another in the second direction while overlapping with the active patterns. A plurality of second interconnection lines extend in the second direction to intersect the active patterns and the first interconnection lines above the cell regions. The plurality of second interconnection lines may be spaced apart from one another in the first direction. A plurality of memory cells may each be positioned at intersection portions of the first and second interconnection lines of the cell regions. A plurality of unit cell groups each having i×j memory cells in the first and second directions may be provided, wherein i represents a number of the second interconnection lines and j represents a number of the active patterns in an unit cell group. A plurality of strapping contacts may be in the strapping regions such that the active patterns to contact the first interconnection lines through the strapping contacts. The strapping contacts on each active pattern may be in at least one of the strapping regions.

The strapping contacts on each active pattern may be positioned in every other strapping region in the first direction. The strapping contacts may be arranged along every 2x memory cells in each active pattern in the first direction, wherein x represents the number of bit lines between the strapping regions in each active pattern. The strapping contacts in each strapping region may be positioned on every other active pattern in the second direction.

At least two of the strapping contacts in each strapping region may be arranged on a same line. The strapping contacts on each active pattern may be positioned in each strapping region in the first direction. The strapping contacts may be arranged every x memory cells in each active pattern in the first direction, wherein x represents the number of bit lines between the strapping contacts in each active pattern. The strapping contacts in each strapping region may cross each other in adjacent active patterns in the second direction.

A first isolation layer may isolate adjacent first interconnection lines of adjacent unit cell groups in the second direction. A second isolation layer having a size smaller than the first isolation layer may isolate adjacent first interconnection lines in the second direction within each of the unit cell groups.

BRIEF DESCRIPTION OF THE DRAWINGS

Example embodiments will be more clearly understood from the following detailed description taken in conjunction with the accompanying drawings. FIGS. 1-6B represent non-limiting, example embodiments as described herein.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation, which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted might occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to semiconductor memory devices. Other example embodiments relate to semiconductor memory devices having strapping contacts in a strapping region with an increased pitch.

Figure 2:
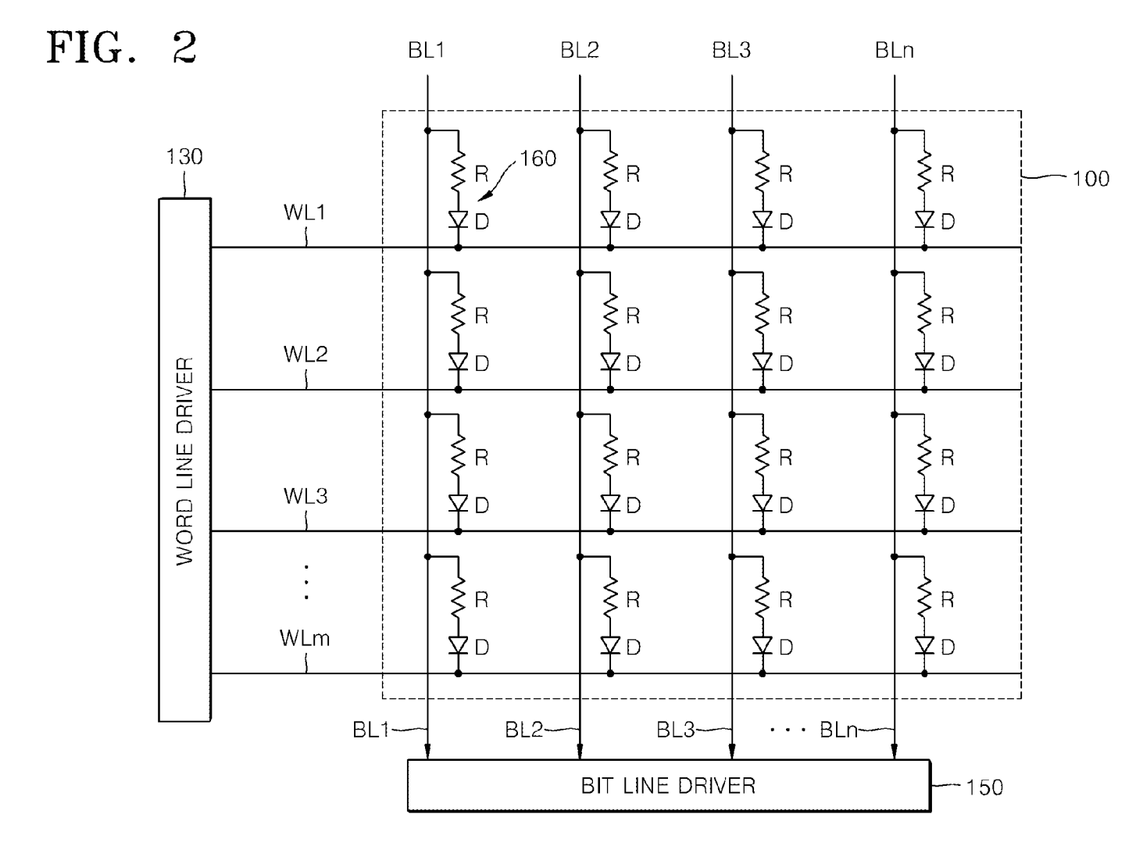
FIG. 2 is a block diagram illustrating a memory cell array 100 in a semiconductor memory device according to examples embodiments.

FIG. 2 is a block diagram illustrating a memory cell array 100 in a semiconductor memory device according to example embodiments wherein each memory cell in the memory cell array 100 has a diode structure.

Referring to FIG. 2, a memory cell array 100 may be formed in a cell array region of the semiconductor memory device. Word line drivers 130 and bit line drivers 150 may be arranged in a peripheral circuit region. The memory cell array 100 includes a plurality of word lines WL1 to WLm and a plurality of bit lines BL1 to BLn. The word lines WL1 to WLm and bit lines BL1 to BLn may intersect each other. A plurality of memory cells 160 may be arranged in a matrix form. The memory cells 160 may be connected to the word lines WL1 to WLm and the bit lines BL1 to BLn. The word lines WL1 to WLm and the bit lines BL1 to BLn are each connected to the word and bit line drivers 130 and 150 arranged in the peripheral circuit region.

The memory cells 160 may include PRAM cells. Each of the memory cells 160 may include a phase-change storage element R and a cell diode D connected in series. The phase-change storage element R may include a phase-change material layer (layer 230 of FIGS. 4A and 4B). The phase-change storage elements R of the memory cells 160 may be connected to the bit lines BL1 to BLn. The cell diodes D of the memory cells 160 may be connected to the word lines WL1 to WLm.

In a program operation, if a current is applied to the memory cells 160 through the bit lines BL1 to BLn and the word lines WL1 to WLm are transited to a low or ground level, a forward current flows in the cell diodes D from the bit lines BL1 to BLn to the word lines WL1 to WLm. As such, the phase-change material layer 230 of the phase-change storage element R in each of the memory cells 160 exhibits a phase change to a high-resistance reset state or low-resistance set state.

In a read operation, data is read by detecting a current flowing through each of the memory cells 160 depending on a state thereof (e.g., a set or reset state). If the memory cell 160 is in a low-resistance set state, a current flowing through the memory cell 160 may be substantially large and the memory cell 160 is read as data "0." If the memory cell 160 is in a high-resistance reset state, a current flowing through the memory cell 160 may be substantially small and the memory cell 160 is read as data "1."

The word line driver 130 selects one of the word lines WL1 to WLn while the memory cells 160 are in a read or program mode. The bit line driver 150 selects at least one of the bit lines BL1 to BLn. The number of bit lines selected by the bit line driver 150 may be determined depending on an amount of data output from a memory device at a time. For example, assuming that 8-bit data are output, the bit line driver 150 simultaneously selects 8-bit lines in the bit lines BL1 to BLn.

Figure 3:
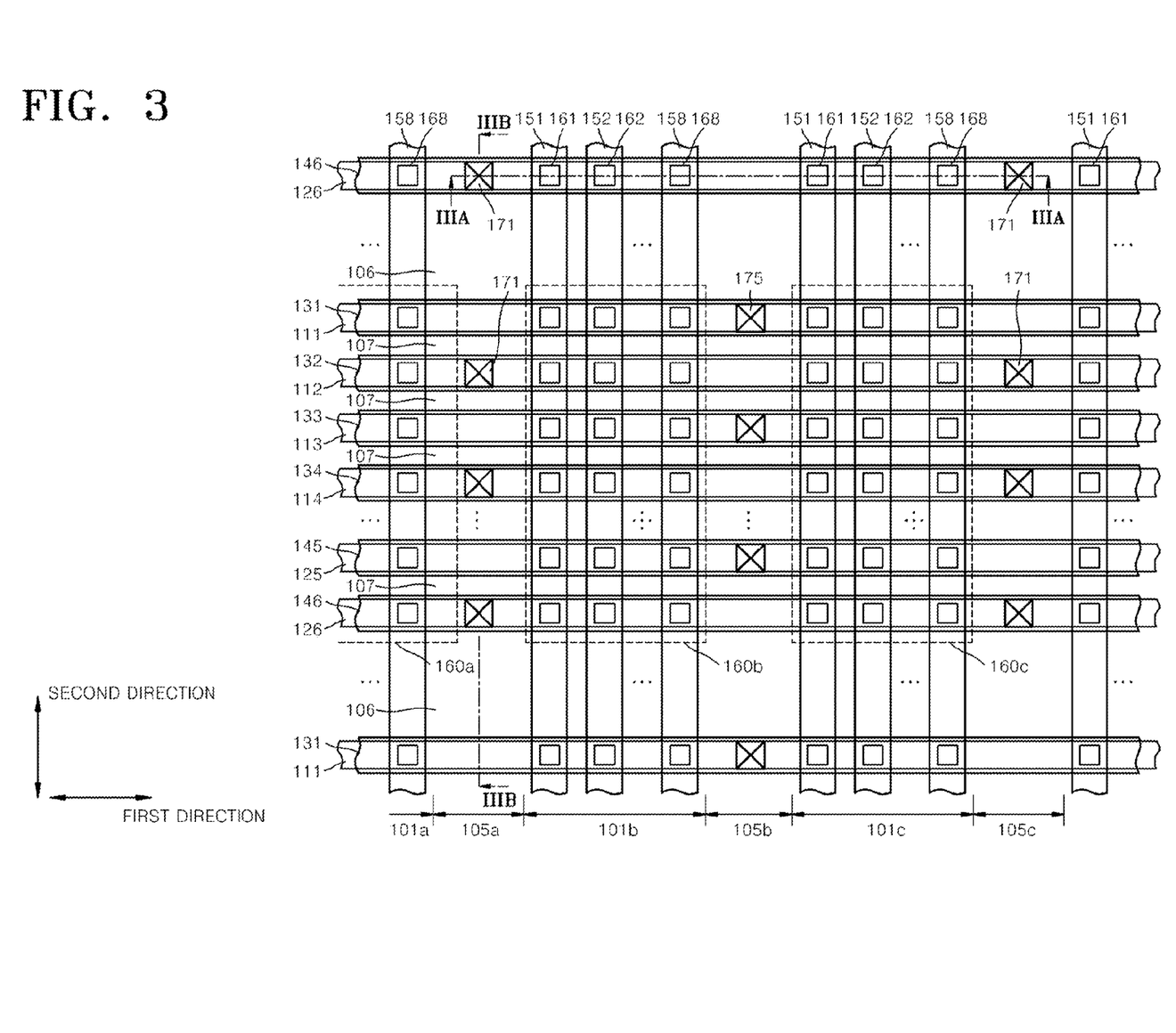
FIG. 3 is a diagram illustrating a plan view of the memory cell array in a semiconductor memory device according to examples embodiments.
Figure 4A:
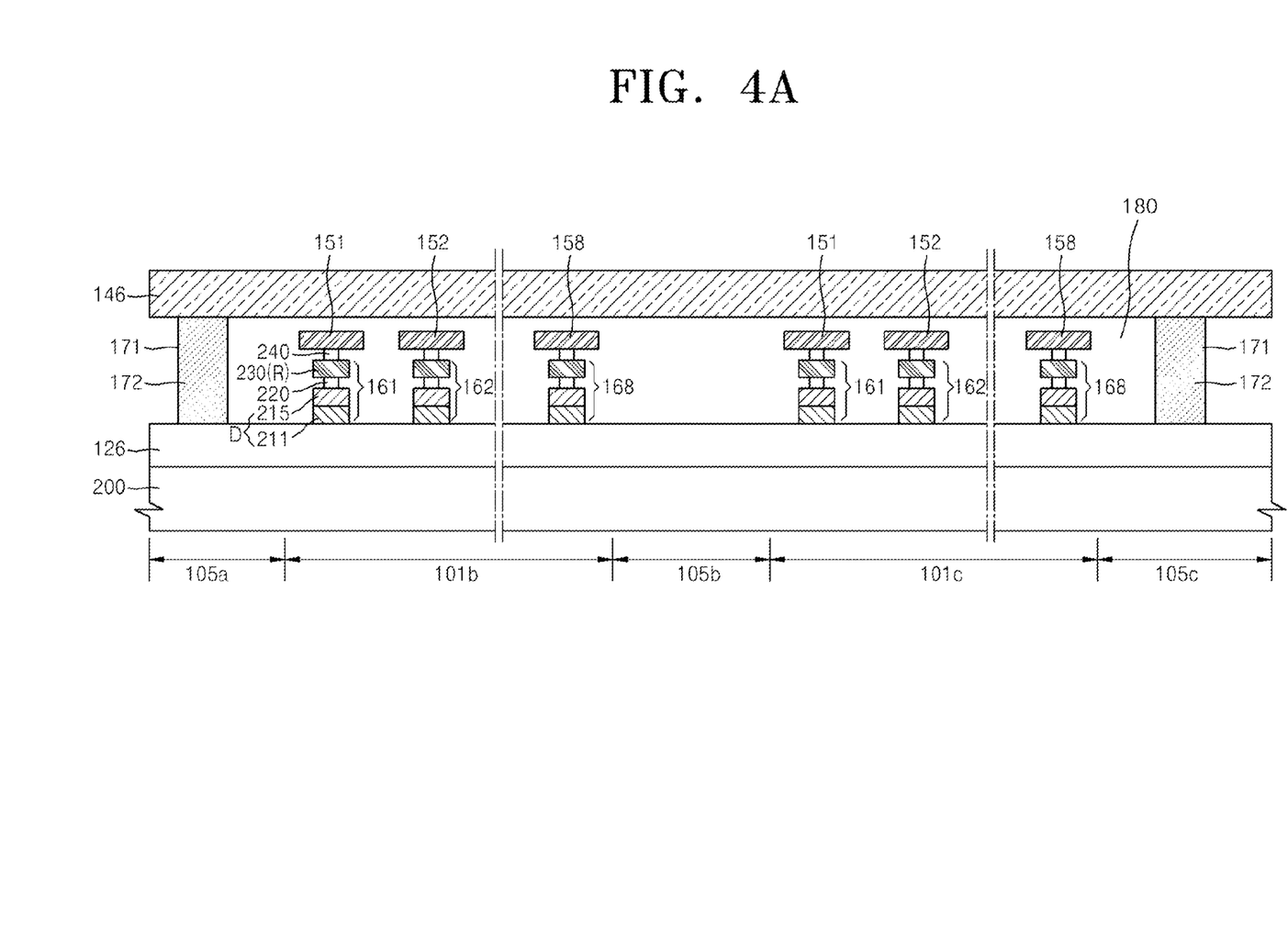
FIG. 4A is a diagram illustrating a cross-sectional view of the memory cell array taken along line IIIA-IIIA in FIG. 3.
Figure 4B:
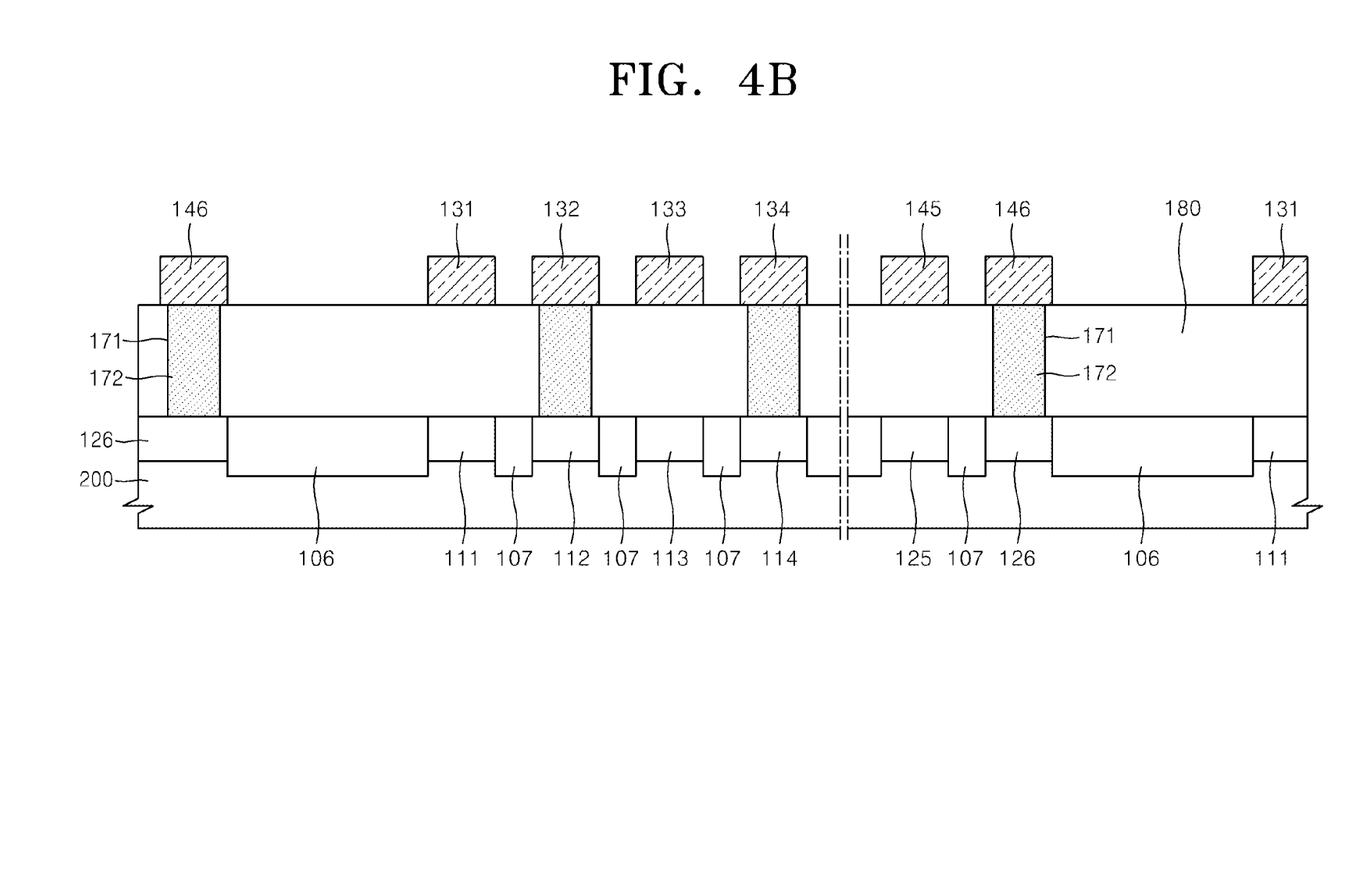
FIG. 4B is a diagram illustrating a cross-sectional view of the memory cell array taken along line IIIB-IIIB in FIG. 3.

FIG. 3 is a diagram illustrating a plan view of a memory cell array in a semiconductor memory device according to examples embodiments. FIG. 4A is a diagram illustrating a cross-sectional view of the memory cell array taken along line IIIA-IIIA in FIG. 3. FIG. 4B is a diagram illustrating a cross-sectional view of the semiconductor memory device taken along line IIIB-IIIB in FIG. 3.

Referring to FIGS. 3, 4A and 4B, the semiconductor memory device includes cell regions 101a, 101b and 101c and a plurality of strapping regions 105a, 105b and 105c. The cell regions 101a, 101b and 101c may each include a plurality memory cells 161, 162 and 168 arranged therein. The plurality of strapping regions 105a, 105b and 105c may each include strapping contacts 171 and 175 arranged therein. The strapping regions 105a, 105b and 105c may be arranged between adjacent cell regions in the cell regions 101a, 101b and 101c.

A plurality of active patterns 111, 112, 113, 114, 125 and 126 may be arranged in a first direction. The active patterns 111, 112, 113, 114, 125 and 126 may be shaped in long stripes. The active patterns may be spaced apart from one another in a second direction intersecting the first direction.

A plurality of word lines 131, 132, 133, 134, 145 and 146 may be arranged in the first direction. The word lines 131, 132, 133, 134, 145 and 146 may overlap with the active patterns 111, 112, 113, 114, 125 and 126. The word lines 131, 132, 133, 134, 145 and 146 may be spaced apart from one another in the second direction along the active patterns 111, 112, 113, 114, 125 and 126.

A plurality of bit lines 151, 152 and 158 may extend in the second direction. The bit lines 151, 152 and 158 may intersect the word lines 131, 132, 133, 134, 145 and 146 and the active patterns 111, 112, 113, 114, 125 and 126. The bit lines 151, 152 and 158 may be spaced apart from one another in the first direction.

In cell regions 101a, 101b and 101c, the plurality of memory cells 161, 162 and 168 may be arranged on top surfaces of the active patterns 111, 112, 113, 114, 125 and 126 where the word lines 131, 132, 133, 134, 145 and 146 intersect the bit lines 151, 152 and 158. The memory cells 161, 162 and 168 may be included in each unit cell group 160a, 160b and 160c. Each of the unit cell groups 160a, 160b and 160c includes i×j memory cells, wherein i represents the number of bit lines and j represents the number of active patterns in each unit cell. For example, each of the unit cell groups 160a, 160b and 160c may include 8×16 memory cells, wherein there are 8 bit lines and 16 active patterns in the unit cell.

The strapping regions 105a, 105b and 105c may be arranged between the unit cell groups 160a, 160b and 160c in a parallel (or lateral) direction as the word line (e.g., along the first direction). The active patterns 111, 112, 113, 114, 125 and 126 may contact the word lines 131, 132, 133, 134, 145 and 146 via the strapping contacts 171 and 175 arranged in the strapping regions 105a, 105b and 105c. The strapping contacts 171 and 175 may be arranged in a zigzag form in adjacent strapping regions 105a, 105b and 105c.

The strapping contacts 171 and 175 in each of the strapping regions 105a, 105b and 105c may be arranged in a straight line along a parallel (or lateral) direction as the bit lines 151, 152 and 158. Each of the strapping contacts 171 and 175 may be positioned on every other of the active patterns 111, 112, 113, 114, 125 and 126. Each of the strapping contacts 171 and 175 may be positioned on every other unit cell group 160a, 160b and 160c along the parallel (or lateral) direction of the word lines 131, 132, 133, 134, 145 and 146. Each of the strapping contacts 171 and 175 may be positioned along every 2x memory cells, wherein x represents the number of bit lines between the strapping regions in each active pattern. For example, if there are 8 bit lines between the strapping regions, there are 16 memory cells between each strapping contact in an active pattern.

In example embodiments, because strapping contacts in each of the strapping regions are positioned on every other active pattern in the lateral direction of the bit line, a pitch of the strapping contacts in the lateral direction of the bit line may be increased by two times. A space between adjacent strapping contacts in the lateral direction of the bit line may be increased by three times compared to the memory device of FIG. 1, in which the strapping contacts in a strapping region are positioned on every other active pattern in the lateral direction of the bit line. As such, a contact margin of the strapping contacts in the semiconductor device increases.

Each of the active patterns 111, 112, 113, 114, 125 and 126 may include an active pattern doped with high-density impurities (e.g., n-type impurities). A first isolation layer 106 may isolate the active patterns 126 and 111 within adjacent unit cell groups in the unit cell groups 160a, 160b and 160c in the lateral direction of the bit lines 151, 152 and 158, which are along the second direction. The active patterns 111, 112, 113, 114, 125 and 126 within each of the unit cell groups 160a, 160b and 160c may be isolated from one another by a second isolation layer 107. Each of the first and second isolation layers 106 and 107 may have a shallow trench isolation structure. Each of the first and second isolation layers 106 and 107 may have a LOCOS isolation structure or the like. The first isolation layer 106 may have a size larger than the second isolation layer 107.

The memory cells 161, 162 and 168 may be isolated from one another in a multi-layered insulating layer 180. The multi-layered insulating layer 180 may include an interlayer dielectric layer (not shown). For example, each of the memory cells 161, 162 and 168 may include a cell diode D and a phase-change storage element R. The cell diode D may include a cathode pattern 211 positioned on the substrate 200 and an anode pattern 215 positioned on the cathode pattern 211. The cathode pattern 211 and the anode pattern 215 may include n-type and p-type semiconductor patterns.

The cathode pattern 211 may have an impurity density lower than the anode pattern 215. The cathode pattern 211 may have an impurity density lower than the active patterns 111, 112, 113, 114, 125 and 126. The cathode pattern 211 and the anode pattern 215 may be formed through a selective epitaxial growth method.

The cell diode D may include a diode electrode layer (not shown) formed of a metal silicide layer (not shown), which is positioned on the anode pattern 215.

The phase-change storage element R may be positioned above the cell diode D. The phase-change storage element R may include a phase-change material layer 230. The phase-change material layer 230 may include a chalcogenide layer (e.g., a germanium stibium tellurium (GeSbTe) layer). The phase-change storage element R may include upper and lower electrodes (not shown) arranged above and below the phase-change material layer 230, respectively. Each of the upper and lower electrodes may include a material that does not react to the phase-change material layer 230 (e.g., TiN or TiAlN). The anode pattern 215 of the cell diode D and the phase-change material layer 230 of the phase-change storage element R may be connected to each other through a contact plug 220. The contact plug 220 may include a conductive plug (e.g., a metal plug). A process of forming the contact plug 220 may be omitted.

Each of the bit lines 151, 152 and 158 may be positioned above the phase-change storage element R. Each of the bit lines 151, 152 and 158 may include a metal with desirable conductivity. Each of the bit lines 151, 152 and 158 may contact the phase-change material layer 230 through a contact plug 240. The contact plug 240 may include a conductive plug (e.g., a metal plug). A process of forming the contact plug 240 may be omitted.

The multi-layer insulating layer 180 includes strapping contacts 171 and 175 and exposes portions of the active patterns 111, 112, 113, 114, 125 and 126 in the strapping regions 105a, 105b and 105c. Conductive plugs 172 and 176 (e.g., metal plugs) may be formed in the strapping contacts 171 and 175, respectively. Each of the strapping contacts 171 and 175 may be positioned in every other of the strapping regions 105a, 105b and 105c.

The word lines 131, 132, 133, 134, 145 and 146 electrically connected to the active patterns 111, 112, 113, 114, 125 and 126 through the conductive plugs 172 and 176 formed in the strapping contacts 171 and 175 may be arranged along the active patterns 111, 112, 113, 114, 125 and 126. Because each of the active patterns 111, 112, 113, 114, 125 and 126, which function as a word line, has a substantially large resistance, the word lines 131, 132, 133, 134, 145 and 146 may be connected to the active patterns 111, 112, 113, 114, 125 and 126 through the strapping contacts 171 and 175 to prevent a delay. As such, the semiconductor device may have a higher operating speed.

Figure 5:
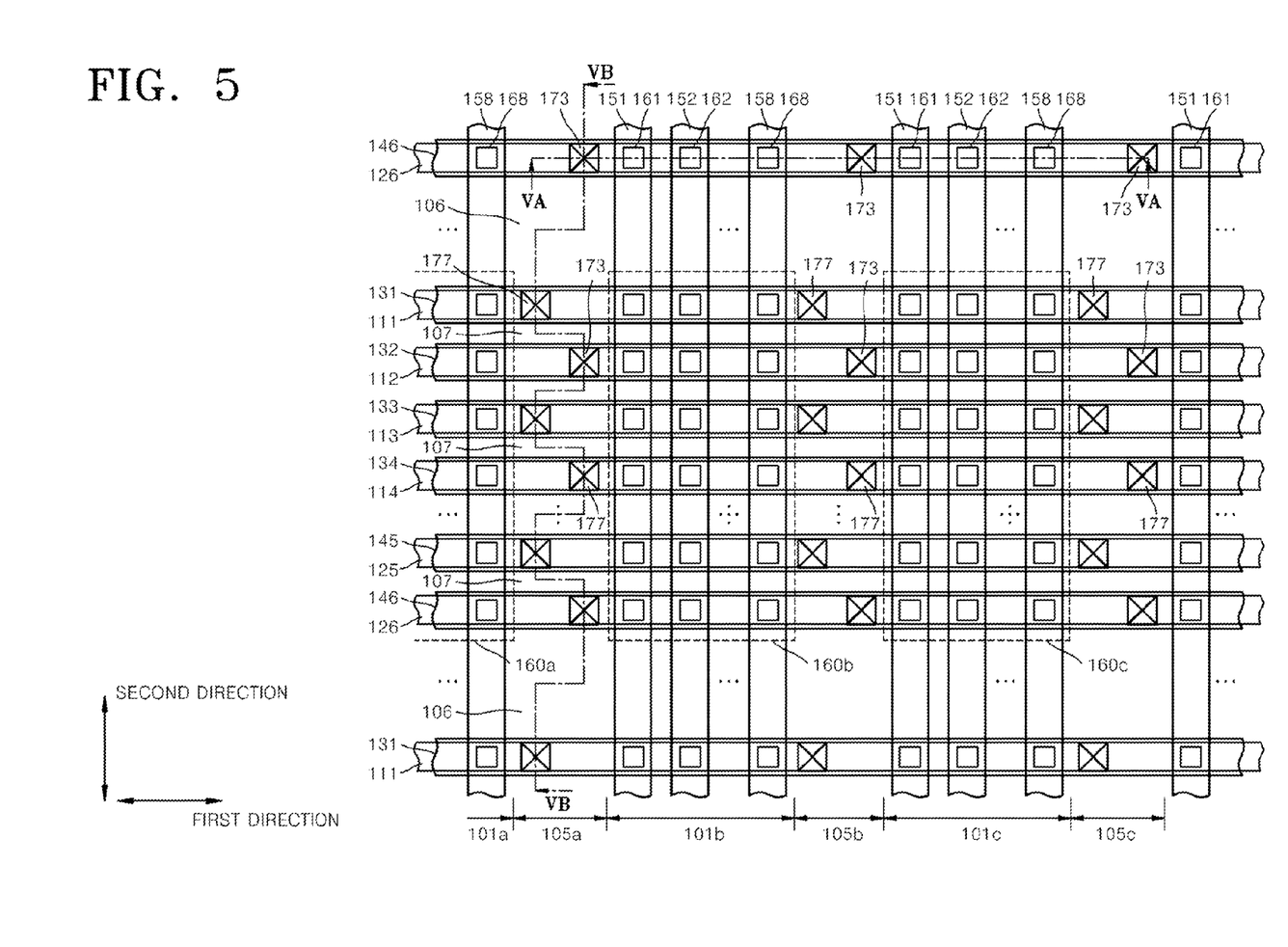
FIG. 5 is a diagram illustrating a plan view of a memory cell array in a semiconductor memory device according to example embodiments.
Figure 6A:
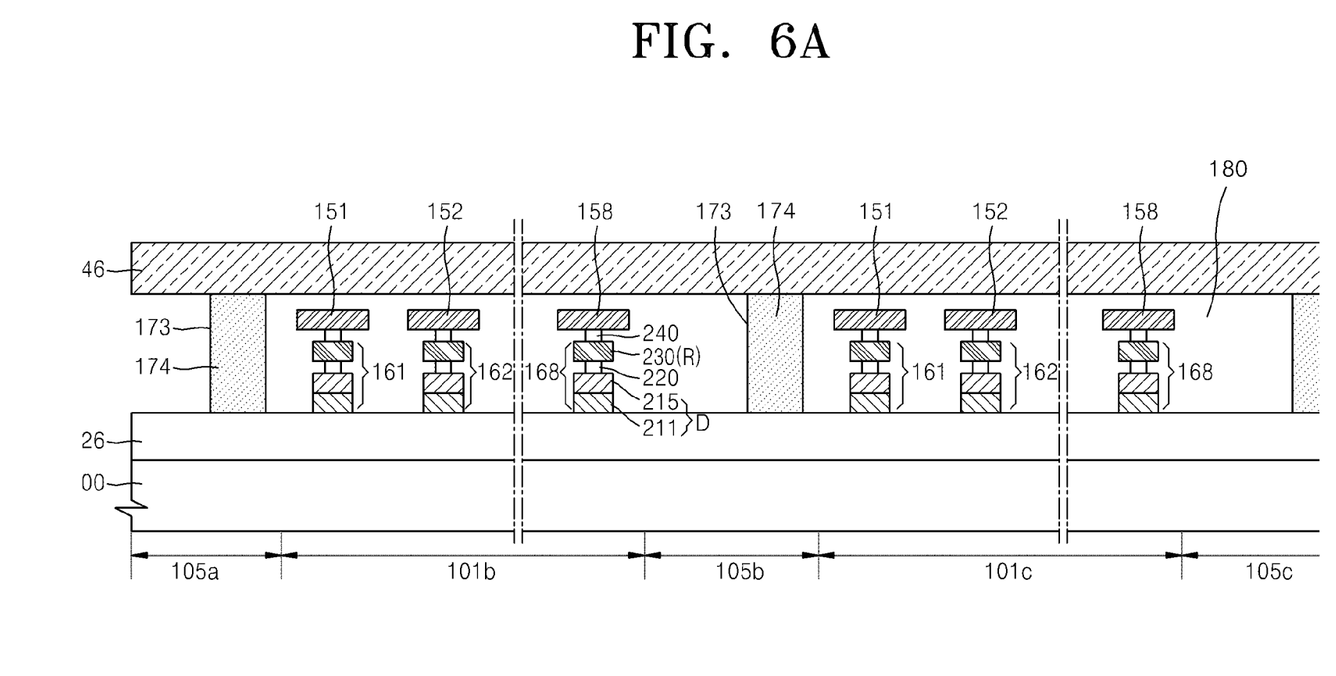
FIG. 6A is a diagram illustrating a cross-sectional view of the memory cell array taken along line VA-VA in FIG. 5.
Figure 6B:
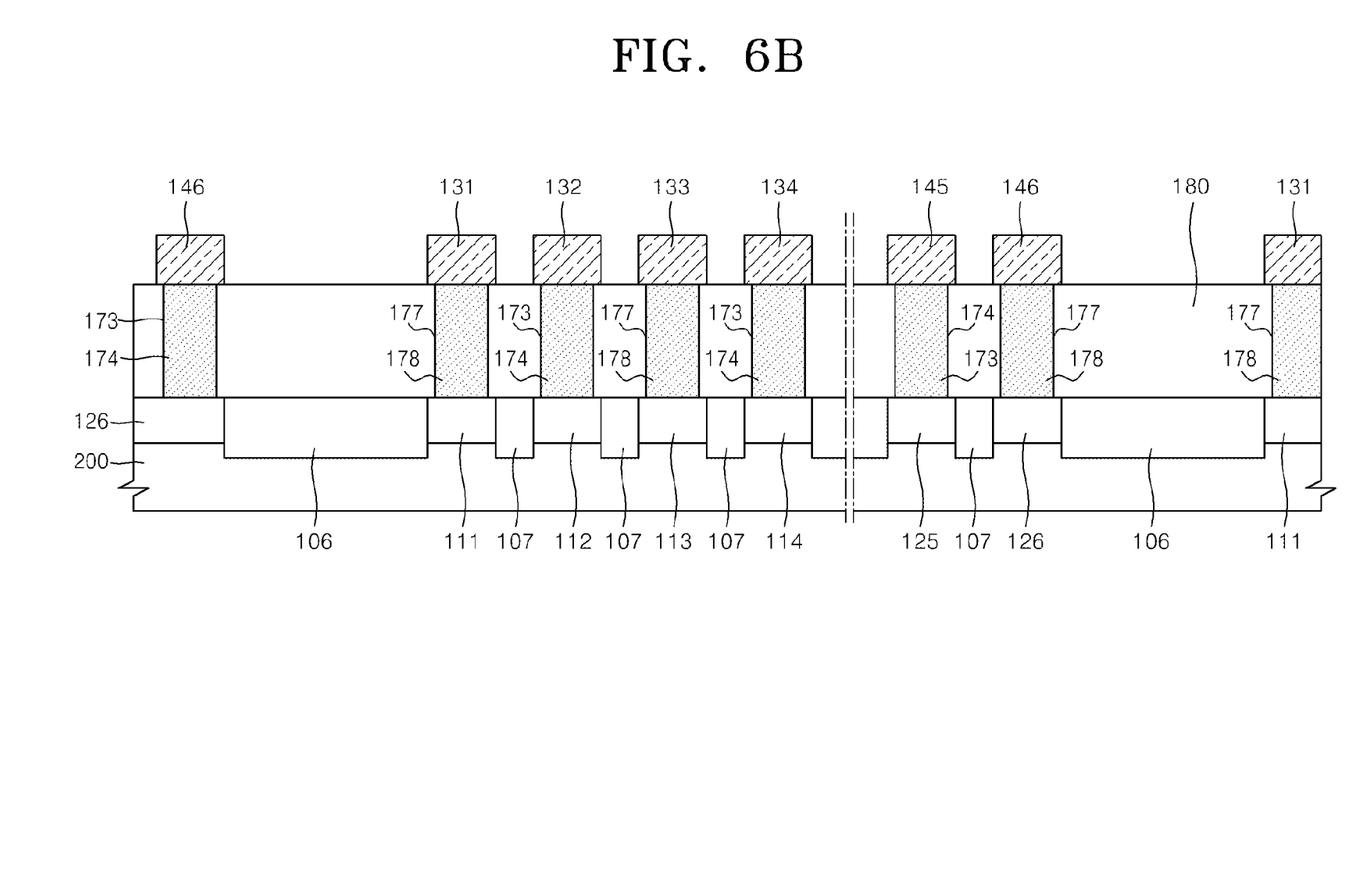
FIG. 6B is a diagram illustrating a cross-sectional view of the memory cell array taken along line VB-VB in FIG. 5.

FIG. 5 is a diagram illustrating a plan view of a memory cell array in a semiconductor memory device according to example embodiments. FIG. 6A is a diagram illustrating a cross-sectional view of the memory cell array taken along line VA-VA in FIG. 5. FIG. 6B is a diagram illustrating a cross-sectional view of the memory cell array taken along line VB-VB in FIG. 5.

The memory cell array in the semiconductor memory device shown in FIGS. 5, 6A and 6B is similar to the memory array in the semiconductor memory device shown in FIGS. 3, 4A and 4B, except that the strapping contacts are in another arrangement according to example embodiments. Thus, a description of like elements will be omitted for the sake of brevity.

Strapping regions 105a, 105b and 105c may be arranged between cell regions 101a, 101b and 101c in a parallel (or lateral) direction as word lines 131, 132, 133, 134, 145 and 146, which extend in a first direction. Unit cell groups 160a, 160b and 160c each having i×j memory cells 161, 162 to 168 are positioned in the cell regions 101a, 101b and 101c, respectively. Strapping contacts 173 and 177 are arranged in each of the strapping regions 105a, 105b and 105c. The active patterns 111, 112, 113, 114, 125 and 126 contact the word lines 131, 132, 133, 134, 145 and 146 through the strapping contacts 173 and 177. The strapping contacts 173 and 177 in each of the strapping regions 105a, 105b and 105c may be arranged in a zigzag form.

The strapping contacts 173 and 177 in each of the strapping regions 105a, 105b and 105c may cross (or traverse) each other in a parallel (or lateral) direction of the bit lines 151, 152 and 158. One of the strapping contacts 173 and 177 in each of the strapping regions 105a, 105b and 105c may be positioned on each active pattern 111, 112, 113, 114, 125 and 126. The strapping patterns 177 positioned on odd-numbered active patterns 111, 113, . . . and 125 may be arranged in a line. The strapping contacts 173 positioned on even-numbered active patterns 112, 114, . . . and 126 may be arranged in another line. Each of the strapping contacts 173 and 177 may be positioned on each unit cell group 160a, 160b and 160c in the parallel (or lateral) direction as the word lines 131, 132, 133, 134, 145 and 146. Each of the strapping contacts 173 and 177 may be positioned on every x memory cells, wherein x represents the number of bit lines between the strapping contacts in each active pattern. For example, if there are 8 bit lines between the strapping contacts in an active pattern, there are 8 memory cells between the strapping contacts in the lateral direction of word lines.

Because the strapping contacts 173 and 177 in each of the strapping regions 105a, 105b and 105c cross each other in the lateral direction of the bit lines, a pitch of the strapping contacts 173 and 177 in the lateral direction of the bit lines increases by two times. A space between adjacent strapping contacts 173 and 177 increases by three times as compared with the memory device shown in FIG. 1, in which strapping contacts in each of the strapping regions are positioned on every active pattern in the lateral direction of the bit line. As such, a contact margin of the strapping contacts 173 and 177 of the semiconductor device increases.

The strapping contacts 173 and 177 may be included in an interlayer dielectric layer 180. The interlayer dielectric layer 180 may expose portions of the active patterns 111, 112, 113, 114, 125 and 126 in the strapping regions 105a, 105b and 105c. Each of the strapping contacts 173 and 177 may be positioned in each strapping region 105a, 105b and 105c. Conductive plugs 174 and 178 may each be formed in the strapping contacts 173 and 177, respectively. The word lines 131, 132, 133, 134, 145 and 146 may overlap with the active patterns 111, 112, 113, 114, 125 and 126. The word lines 131, 132, 133, 134, 145 and 146 may be electrically connected to the active patterns 111, 112, 113, 114, 125 and 126 through the strapping contacts 173 and 177.

The sectional structure of the PRAM cell according to example embodiments may be modified. Example embodiments may be used in a PRAM cell including a transistor and a phase-change storage element. Example embodiments may be used in a device where bit lines are strapped. Although a PRAM has been described in the above examples embodiments, example embodiments are not limited thereto. For example, examples embodiments may be used in a non-volatile memory device (e.g., magnetic random access memory (MRAM) or ferroelectric random access memory (FRAM)) or a volatile memory device (e.g., DRAM) where the memory device has a strapping region positioned in each memory cell group or the like.

As described above, in a semiconductor memory device according to example embodiments, an arrangement structure of strapping contacts in a strapping region may be modified such that the formation of contact bridges may be prevented (or reduced).

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
a plurality of cell regions and a plurality of strapping regions between adjacent cell regions on a semiconductor substrate, wherein the cell regions are spaced apart from one another in a first direction and the cell regions and strapping regions extend in a second direction intersecting the first direction;
a plurality of active patterns extending in the first direction throughout the cell regions and strapping regions, wherein the plurality of active patterns are spaced apart from one another in the second direction intersecting the first direction;
a plurality of first interconnection lines extending in the first direction throughout the cell regions and the strapping regions, wherein the plurality of first interconnection lines are spaced apart from one another in the second direction and overlap with the active patterns;
a plurality of second interconnection lines extending in the second direction and intersecting the active patterns and the first interconnection lines in the cell regions, wherein the plurality of second interconnection lines are spaced apart from one another in the first direction;
a plurality of memory cells each at intersection portions of the first and second interconnection lines in the cell regions; and
a plurality of strapping contacts in the strapping regions, wherein the active patterns contact the first interconnection lines through the strapping contacts and the strapping contacts in each of the strapping regions are on at least one of the active patterns, wherein the strapping contacts in each of the strapping regions are on the active patterns in a zigzag form in the second direction, and wherein the strapping contacts are along every x of the memory cells on each of the active patterns in the first direction, x representing a number of the second interconnection lines between the strapping regions along each of the active patterns.

2. The semiconductor memory device of claim 1, wherein the first interconnection lines includes word lines and the second interconnection lines includes bit lines.

3. The semiconductor memory device of claim 1, wherein the strapping contacts in adjacent strapping regions are on the active patterns in the zigzag form in the second direction.

4. The semiconductor memory device of claim 1, wherein the active patterns include impurity regions doped with selected conductive type impurities in the semiconductor substrate.

5. The semiconductor memory device of claim 1, wherein the memory cells include phase-change random access memory (PRAM) cells.

6. The semiconductor memory device of claim 1, further comprising a plurality of unit cell groups each having a number of the memory cells, i×j, in the first and second directions, wherein i represents a number of the second interconnection lines and j represents a number of the active patterns in each respective unit cell group.

7. The semiconductor memory device of claim 6, wherein the first interconnection lines include a plurality of word lines and the second interconnection lines include a plurality of bit lines.

8. The semiconductor memory device of claim 6, further comprising:
a first isolation layer that isolates adjacent active patterns of adjacent unit cell groups in the second direction; and
a second isolation layer that isolates adjacent active patterns in the second direction within each of the unit cell groups, wherein the second isolation layer has a size smaller than the first isolation layer.

9. The semiconductor memory device of claim 6, wherein the active patterns include impurity regions doped with conductive type impurities in the semiconductor substrate.

10. The semiconductor memory device of claim 6, wherein every other strapping contact in each of the strapping regions is arranged in a straight line in the second direction.

11. The semiconductor memory device of claim 10, wherein the strapping contacts on each active pattern are in each strapping region in the first direction.

12. The semiconductor memory device of claim 10, wherein the strapping contacts in adjacent active patterns are arranged in the same pattern in the second direction.

* * * * *